US 6,545,448 B1

(12) United States Patent
Stanley et al.

(10) Patent No.: US 6,545,448 B1
(45) Date of Patent: Apr. 8, 2003

(54) DETECTION OF THE END-OF-LIFE FOR A RECHARGEABLE BATTERY (75) Inventors: Randy P. Stanley, Aptos, CA (US); Kelan Craig Silvester, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/025,263

(22) Filed: Dec. 18, 2001

(51) Int. Cl.[7] .......................... H02J 7/00; H01M 10/44; H01M 10/46
(52) U.S. Cl. ................................................ 320/132
(58) Field of Search ........................ 324/436; 320/127, 320/132, 134, 136, DIG. 21

(56) References Cited

U.S. PATENT DOCUMENTS 6,198,253 B1 * 6/2001 Kurle et al. ................. 320/127
6,337,557 B1 * 1/2002 Kates et al. ................. 320/132
6,362,596 B1 * 3/2002 Brotto ........................ 320/132

* cited by examiner

Primary Examiner—Edward H. Tso
Assistant Examiner—Pia Tibbits
(74) Attorney, Agent, or Firm—Peter Lam (57) ABSTRACT

A method for the detection of the end-of-life for a rechargeable battery. The method of one embodiment comprises identifying a rechargeable battery. A designed capacity of the rechargeable batterty is determined. A present full charge capacity of the rechargeable battery is determined. A status of the rechargeable battery is evaluated. An end-of-life warning for the battery is issued if an end-of-life status is detected.

25 Claims, 6 Drawing Sheets

DETECTION OF THE END-OF-LIFE FOR A RECHARGEABLE BATTERY

FIELD OF THE INVENTION

The present invention relates generally to the field of rechargeable batteries. More particularly, the present invention relates to a method and apparatus for the detection of the end-of-life for a rechargeable battery.

BACKGROUND OF THE INVENTION

Computer systems have become increasingly pervasive in our society. The processing capabilities of computers have increased the efficiency and productivity of workers in a wide spectrum of professions. As the costs of purchasing and owning a computer continues to drop, more and more consumers have been able to take advantage of newer and faster machines. Furthermore, many people enjoy the use of notebook computers because of the freedom. Mobile computers allow users to easily transport their data and work with them as they leave the office or travel. This scenario is quite familiar with marketing staff, corporate executives, and even students.

A similar phenomenon has occurred with other types of electronic devices. A recent plethora of portable devices allow users to work and play free restrictive power cords and adapters. As people work outside of their traditional office, they often find themselves using their notebook computers, cellular phones, digital assistants, etc. as if in a portable office. Similarly, people enjoying themselves away from the home have taken advantage of music players, digital cameras, electronic games, etc. while on the road or outdoors. All of these electronic devices operate on battery power. More particularly, a significant number of the devices use some type of rechargeable battery source.

But over time, even a rechargeable battery will become useless. The ability of a rechargeable battery, to recharge, diminishes over time with its use. Furthermore, certain types of battery technologies do not hold a charge over the entire life of the battery. As a battery is charged, its ability to hold the maximum designed capacity charge reduces with each charging cycle. Unfortunately, users are seldom aware of such a condition and are caught flatfooted when a rechargeable battery does fail.

Some electronic devices such as a notebook computer may include a operating system power management (OPSM) mechanism to track the system power. One existing OSPM utility provides a type gas gauge information in regards to a battery. For example, this utility calculates the remaining battery life as:

$$\text{Remaining Battery Life (in hours)} = \frac{\text{Remaining Battery Charge}}{\text{Battery Present Discharge Rate}}$$

Only the remaining battery life are watched by the utility. However, the capabilities or physical condition of the battery itself are not evaluated.

BRIEF DESCRIPTION OF THE DRAWINGS

The present invention is illustrated by way of example and not limitations in the figures of the accompanying drawings, in which like references indicate similar elements, and in which.

DETAILED DESCRIPTION

A method and apparatus for the detection of the end-of-life for a rechargeable battery is disclosed. The embodiments described herein are described in the context of a mobile computer, but are not so limited. Although the following embodiments are described with reference to a notebook computer system, other embodiments are applicable to other portable computing devices and other handheld electronic devices. The same techniques and teachings of the present invention can easily be applied to other types of rechargeable devices or systems that can benefit from the detection of the end-of-life a rechargeable battery.

In the following description, for purposes of explanation, numerous specific details are set forth in order to provide a thorough understanding of the present invention. One of ordinary skill in the art, however, will appreciate that these specific details are not necessary in order to practice the present inverition. In other instances, well known electrical structures and circuits have not been set forth in particular detail in order to not necessarily obscure the present invention.

Embodiments of the present invention allow for monitor the discharge rate of a rechargeable battery and/or its ability to retain a charge when not under load. By observing patterns typically exhibited by a battery technology at the end of its useful life, a battery monitoring mechanism can provide a user with an indication that the battery integrity has been compromised and that provisions should be made accordingly. For instance, such provisions may include obtaining a replacement battery before the present battery is no longer able to hold a charge. Depending on the particular implementation, a monitoring mechanism may be external to a battery. In the case of a "smart battery", the mechanism may be incorporated within the battery itself. In any case, the system will need to be aware of the battery technology and corresponding end of life characteristics in order to determine the battery capacity and to discern the battery charge level. The types of battery characteristics and information needed to predict an end-of-life situation can be accessed though a Smart Battery interface or the computer system Advanced Configuration and Power Interface (ACPI).

As a battery monitor tracks a specific battery over time, the monitor may notice that the maximum overall charge available after each recharging cycle continues to drop lower and lower. At some point, the ability of this battery to hold an adequate charge will be below a critical threshold level. In other words, the available charge has fallen below a threshold above which the battery is useful for the particular platform it is powering. When the charge is below the critical threshold level, the battery can no longer provide enough power to the device for proper operation. For example, one embodiment may calculate what the present battery threshold as:

$$\text{Battery Value Threshold} = \frac{\text{Last Full Charge Capacity}}{\text{Design Capacity}}$$

Depending on the user setting, the battery value threshold may or may not be at a critical level.

By making the user aware of the looming power problem, the user can proactively take the appropriate steps to prevent loss of data and avoid any inconvenience due to downtime. This functionality can improve the reliability of an electronic device. For instance, a notebook user can realize that the battery is failing and to either plug the machine into a power source or save any open files before the system unexpectedly shuts down. Thus a computer with a battery monitor mechanism in accordance with the present invention can enjoy an improved overall system integrity.

Figure 1A:
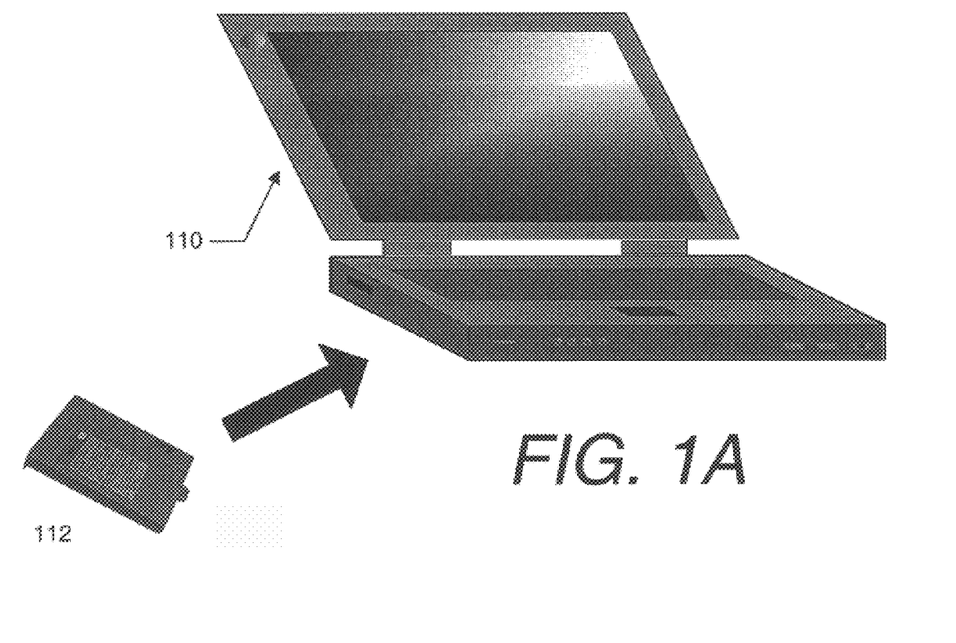
FIGS. 1A–C are illustrations of a devices that can include a mechanism to detect a rechargeable battery end-of-life in accordance with the present invention.
Figure 1B:
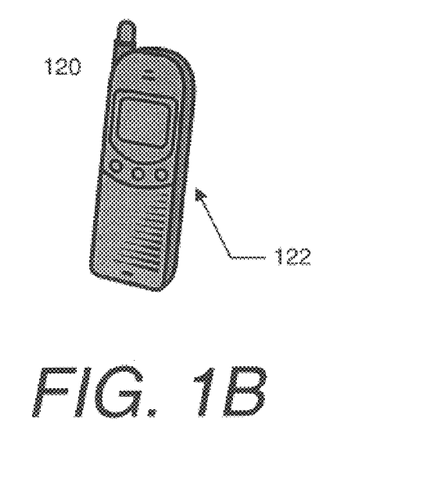
Figure 1C:
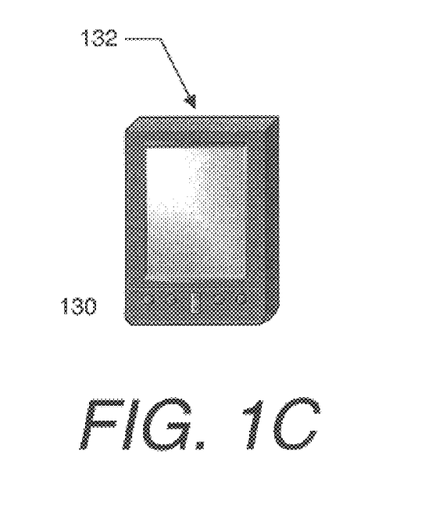

FIGS. 1A–C are illustrations of a devices that can include a mechanism to detect a rechargeable battery end-of-life in accordance with the present invention. For example, FIG. 1A shows a fairly popular use of a rechargeable battery 112. A mobile notebook computer 110 requires power from a removable rechargeable battery 112 mounted in a battery bay. A built-in battery charger may be located in the notebook 110 to recharge the battery when the system is plugged into a power outlet. In some embodiments, the battery charger may be external to the notebook 110. Because most notebook computers 110 are used away from a power outlet, these batteries are cycled numerous times and thus the capacities dramatic reduced over time. A user that depends on portable use of the computer 110 may rely on the functionality of the battery 112. Such a user may want to be promptly notified that a battery 112 is approaching its end-of-life or needs replacing in order to avoid any downtime or interruptions.

The mechanisms and methods of the present invention can be applied any setting where battery power is used. Many users of portable electronic devices and mobile computers are interested in maintaining operability of their tools and preserving stored data. A battery monitor can be incorporated with either hardware or software, or a combination of both, into new and existing systems that can accept a rechargeable battery. The capabilities of a battery monitor are enhanced where a device also provides "smart battery" types of information through a software/hardware interface. Other popular consumer devices that can benefited from a battery monitor include cell phones, personal entertainment devices, video cameras, etc.

Another popular use of a rechargeable battery is shown in FIG. 1B. A cellular phone 120 is mobile by nature and usually away from an unlimited power source except when in its recharger. A cellular phone 120 may have a removable slim-line rechargeable battery 122 to provide power for both standby and talk periods. As time passes, the overall capacity of a battery 122 is diminished even with the phone simply being in standby mode. In order to avoid unexpectedly discovering a dead battery 122, a user may find it useful to know that the maximum capacity of the battery 122 has been significantly reduced from the design capacity and the battery end-of-life will soon be reached. Similarly, a personal digital assistant (PDA) 130 of FIG. 1C also uses a rechargeable battery 132. A user would want to know that a battery end-of-life is approaching in order to prevent any loss of data.

Although these examples are described in the context of computer systems, other embodiments can include other types of computing machines. For example, the notebook computer in FIG. 1A can be replaced with workstations, set top boxes, game consoles, digital televisions, home appliances, palm devices, digital music players, MP3 players, home alarm system, video game machine, cellular phones, and any other type of electronic device that uses rechargeable batteries. Furthermore, the devices do not have to be of the same type, the system of some embodiments can comprise of various combinations of such computing devices.

Figure 2:
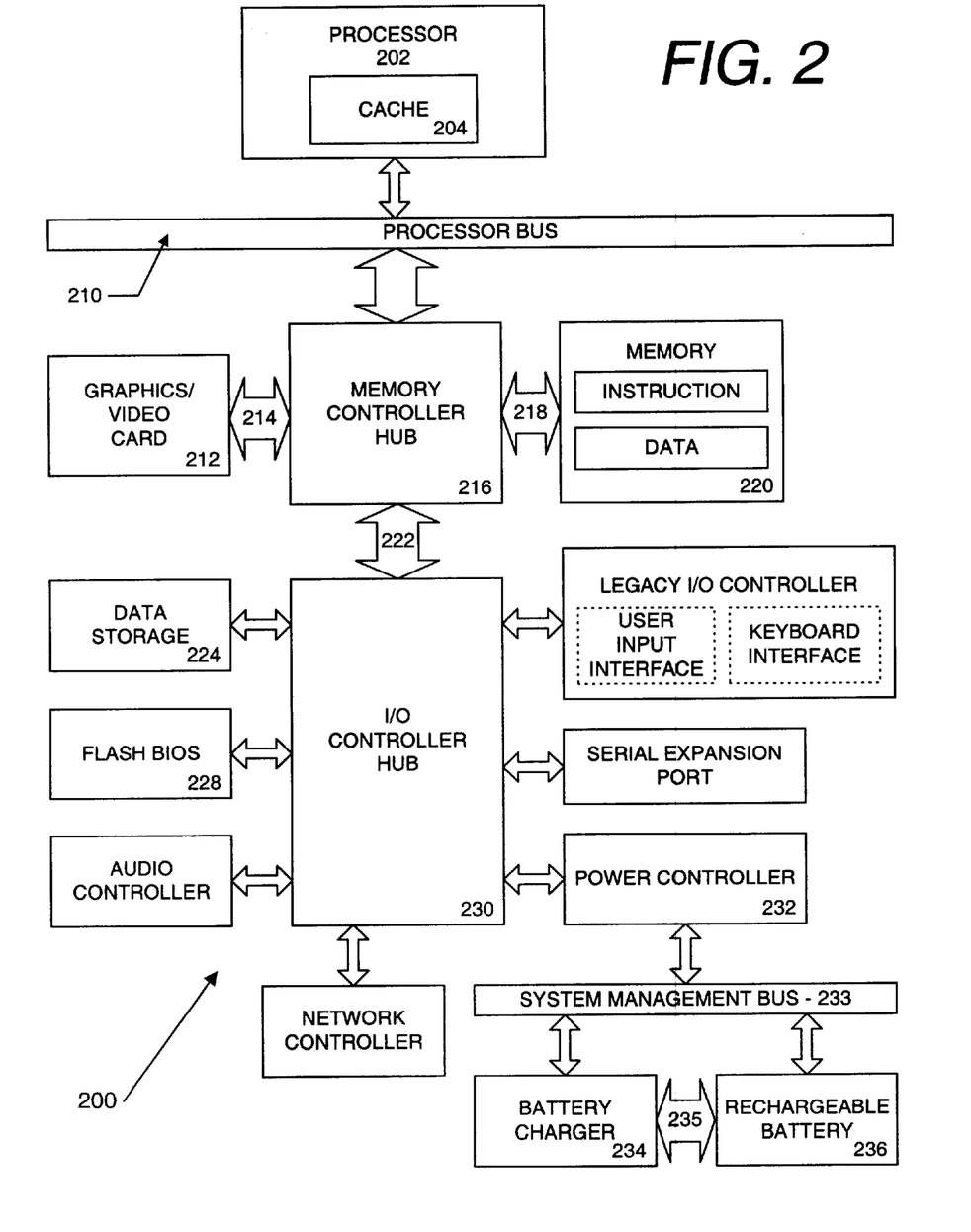
FIG. 2 is a block diagram of one embodiment of a mobile computer system having a capability to detect the end-of-life for. a rechargeable battery.

Referring now to FIG. 2, an exemplary computer system 200 is shown. System 200 is representative of processing systems based on the PENTIUM® III, PENTIUM® 4, Itanium™ and/or StrongARM™ microprocessors available from Intel Corporation of Santa Clara, Cali., although other systems (including PCs having other microprocessors, engineering workstations, set-top boxes and the like) may also be used. In one embodiment, system 200 may execute a version of the WINDOWS™ operating system available from Microsoft Corporation of Redmond, Wash., although other operating systems and graphical user interfaces, UNIX and Linux for example, may also be used. Thus, the present invention is not limited to any specific combination of hardware and software. Similarly, the present enhancement is not limited to computer systems. Alternative embodiments of the present invention can be used in other devices such as embedded applications. Embedded systems can include network computers (NetPC), set-top boxes, network hubs, wide area network (WAN) switches, or any other system which can use a battery or can recharge a battery.

FIG. 2 is a block diagram of a computer system 200 having a capability to detect the end-of-life for a rechargeable battery in accordance with the present invention. The present embodiment is described in the context of a single processor notebook computer, but alternative embodiments can be included in a multiprocessor system. System 200 is an example of a hub architecture. The computer system 200 includes a processor 202 to process data signals. The processor 202 can be a complex instruction set computer (CISC) microprocessor, a reduced instruction set computing (RISC) microprocessor, a very long instruction word (VLIW) microprocessor, a processor implementing a combination of instruction sets, or any other processor device, such as a digital signal processor, for example. The processor 202 is coupled to a processor bus 210 that transmits data signals between the processor 202 and other components in the system 200. The elements of system 200 perform their conventional functions well known in the art.

System 200 includes a memory 220. Memory 220 can be a dynamic random access memory (DRAM) device, a static random access memory (SRAM) device, flash memory device, or other memory device. Memory 220 can store instructions and/or data represented by data signals that can be executed by the processors 202. An internal cache memory 204 can reside inside the processor 202 to store recently used data signals from memory 220. Alternatively, in another embodiment, the cache memory can reside external to the processor 202.

A system logic chip 216 is coupled to the processor bus 210 and memory 220. The system logic chip 216 in the illustrated embodiment is a memory controller hub (MCH). The processor 202 communicates to the MCH 216 via a processor bus 210. The MCH 216 provides a high bandwidth memory path 218 to memory 220 for instruction and data storage and for storage of graphics commands, data and textures. The MCH 216 is to direct data signals between the processor 202, memory 220, and other components in the system 200 and to bridge the data signals between processor bus 210, memory 220, and system I/O 222. In some embodiments, the system logic chip 216 can provide a graphics port for coupling to a graphics controller 212. The MCH 216 is coupled to memory 220 through a memory interface 218. The graphics card 212 is coupled to the MCH 216 through an Accelerated Graphics Port (AGP) interconnect 214.

System 200 uses a proprietary hub interface bus 222 to couple the MCH 216 to the I/O controller hub (ICH) 230. The ICH 230 provides direct connections to some I/O devices via a local I/O bus. The local I/O bus is a high-speed I/O bus for connecting peripherals to the memory 220, chipset, and processor 202. The PCI protocol is commonly associated with a type of the local I/O bus. Some examples are the data storage 224, firmware hub or flash BIOS (Basic Input/Output System) 228, audio controller, legacy I/O controller containing user input and keyboard interfaces, a serial expansion port such as Universal Serial Bus (USB) port, wireless transceiver, and network controller. The data storage device 224 can comprise a hard disk drive, a floppy disk drive, a CD-ROM device, a flash memory device, or other mass storage device.

For the embodiment of a computing system in FIG. 2, a power controller 232 is also coupled to the ICH 230. The power controller 232 is capable of receiving and transmitting signals to and from the system 200 as to settings and status of the power subsystem. The power controller 232 is also connected to a system management bus 233. This power controller 232 can also be referred to as an embedded controller in some embodiments. Control of this power controller 232 resides with software located in the controller logic and memory 220. Also coupled to the system management bus 233 of this embodiment are a battery charger 234 and a rechargeable battery 236. Sensors to measure currents, voltages, temperature, etc. may also be located on the power controller 232, charger 234, and/or battery 236. Although the system management bus 233 of this example has power related devices connected to the bus 233, the system management bus 233 is capable of handling a number of different peripheral devices.

The battery charger 234 is to recharge the rechargeable battery 236 through the power bus 235. Depending on the particular implementation, the system 200 may be capable of handling one or more batteries at the same time. Processor 202 can execute instructions from memory 220 that cause the battery charger 234 to charge, discharge, or cycle the battery 236. Furthermore, the operating system and device driver software can also interface with the battery charger 234 and battery 236 via the power controller 232. System queries in regards to the status and other particular characteristics of the rechargeable battery 236 can be directed to the power controller 232. The power controller 232 can respond with details about each battery in the system 200. Based upon device information received from the battery a mechanism in the power controller 232 or processor 202 can determine the condition of the battery 236. Thus the detection mechanism can evaluate the capacity of a battery 236 and whether the battery end-of-life is approaching.

The battery monitor of this embodiment tracks each battery that is coupled to the system based on characteristics such as its unique serial number, manufacturer, and battery type. Thus as a user swaps different batteries in and out of the device, accurate data is kept in regards to each individual battery for eventual user notification of a battery end-of-life.

The monitoring mechanism of one embodiment can periodically read the battery model number and serial number to detect whether there has been any changes in status of the battery. With a new battery, the monitoring mechanism can track and compare the design capacity of the battery for that particular battery technology against the last full charge capacity. Certain types of battery technologies such as Nickel Cadmium (NiCd) or Nickel Metal Hydride (NiMh) will lose the ability to hold a charge as a battery gets older. Furthermore, the cycling of a battery, which causes repeated charge patterns over the power cells in a battery, also reduces the amount of charge a battery can hold. Lithium Ion (LiON) batteries show this behavior to a far lesser degree, but can still have such a problem, depending on the implementation of the charge methodology and the actual chemistry of the particular battery. The method of the present invention can be used with a variety of rechargeable batteries including NiCd, NiMH, LiON, lithium poly, and alkaline, but are not so limited.

Other factors as to heuristics on the behavior and lifespan of the battery technologies may also considered in determining whether a battery end-of-life is approaching. For example, a user can set a threshold level at which the battery monitor should issue a warning. Thus a user can choose to receive a notification when the battery can only be charged to 50% of its design capacity. Similarly, a message can be sent if the monitor calculates that after last full charge sequence, the battery was capable of delivering just enough power to match 50% of the expected supplied power level. The monitor mechanism can be designed to track and extrapolate the charge/discharge trends for a battery to arrive at predicted battery end-of-life estimation.

Figure 3:
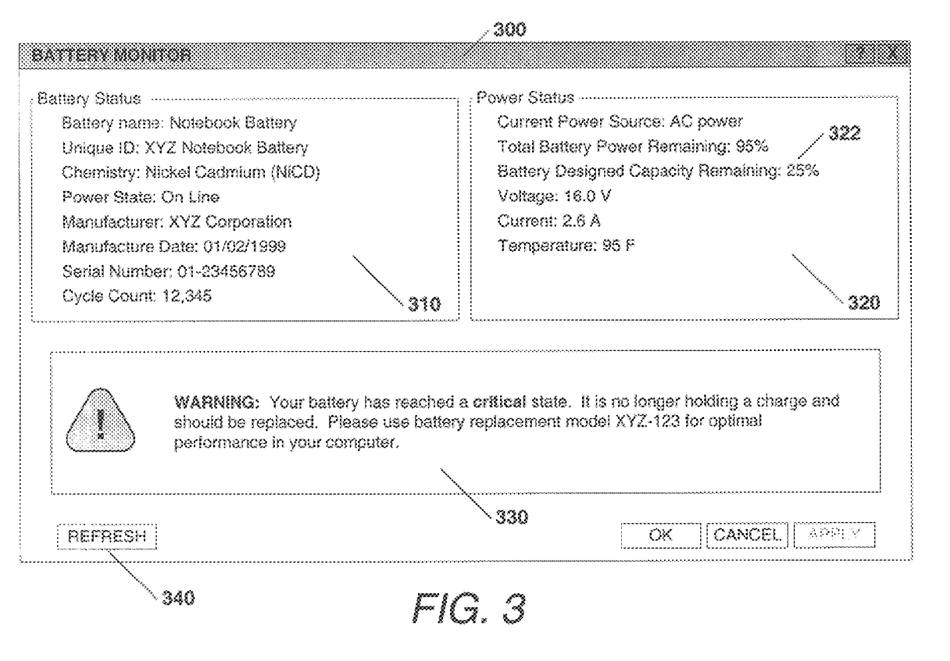
FIG. 3 is an illustration of a battery status and information window for one embodiment.

FIG. 3 is an illustration of a battery status and information window 300 for one embodiment. In this example, the battery monitor sends to a display screen a window 300 with the battery status 310, power status 320, and any other relative messages 330 or information. The window 300 of this embodiment may be brought up by a user upon entering a command or clicking an appropriate icon. Furthermore, the window 300 can be automatically sent to the screen by the battery monitor itself when the battery status is critical or the battery end-of-life threshold is reached. Depending on the implementation, the window can include one or more of the boxes as shown in this example. In another embodiment, multiple windows and/or other types of information boxes may be displayed. A "REFRESH" button 340 allows the user to request the system to update and refresh the information displayed in the window 300.

The battery status box 310 of the battery monitor window 300 in FIG. 3 offers numerous bits of information about the battery. For example, the battery status box 310 displays the battery name, unique battery identifier (ID), chemistry type, power state. Furthermore, the battery status box 310 provides the name of the battery manufacturer, battery manufacture date, battery serial number, and cycle count.

Similarly, the power status box 320 of the battery monitor window 300 offers information as to the present operating conditions and power status. For example, the power status box 320 displays the current power source, total battery power remaining, operating voltage, operating current, and present temperature. Furthermore, the power status box 320 indicates the battery designed capacity remaining 322. From this capacity remaining value 322, a user can notice the condition of the present rechargeable battery. Thus a user can be kept informed as to the status of the battery power cells. The designed capacity can also indicated from the image burnt into the power cells of the battery at the time of manufacturer. An information/warning box 330 is also included in this example to notify the user about the power subsystem. For instance, the information/warning box 330 here issues a warning that the battery of this device has reached a critical state. The user is also told of the nature of the warning and how to remedy the problem. In this case, the recommendation is to replace the battery.

Figure 4:
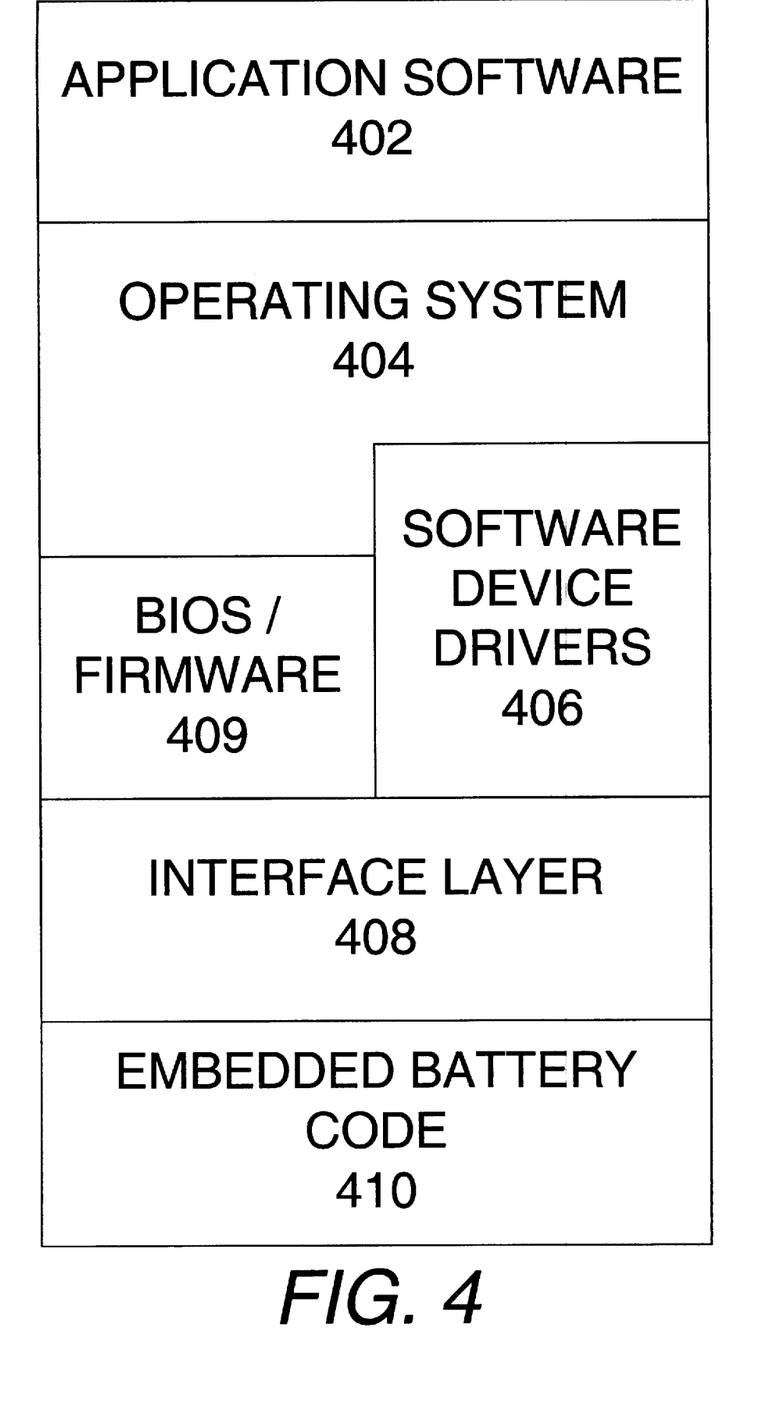
FIG. 4 is a block diagram of the software stack residing in a computer of one embodiment.

FIG. 4 is a block diagram of the software stack residing in a computer of one embodiment. The software stack shown in FIG. 4 comprises of application software 402, an operating system 404, software device drivers 406, an interface layer 408, and embedded battery code 410. For one embodiment, the upper level of the software stack in the computer is application software 402. The application software 402 runs on top of the operating system 404, such as a version of Microsoft Windows. The operating system 404 is generally the software interface between a user and system hardware. A user can input commands and data to control software application 402, which in turn directs the inputs to the appropriate portions of the operating system 404.

The next layer of software in the stack comprises of software device drivers 406. Device drivers 406 handle the software commands and instructions from the operating system 404 and issues the related control signals to hardware devices or controllers. Often, a device driver 406 is provided by the hardware manufacturer and is specific to a particular hardware device. However, generic device drivers may also be available for devices such as keyboards and mice. These device drivers 406 can also be part of the operating system 404. In the software stack of this embodiment, a interface layer 408 exists between the software device drivers 406 and the embedded battery code 410. For this embodiment, the interface layer is firmware within a power controller and can comprise of a mix of hardware circuitry and embedded code. This interface layer 408 enables the software device drivers 406 to use the power controller to communicate with devices in the power subsystem such as a battery and a battery charger. The interface layer 408 of this embodiment translates commands and data packets from the device drivers 406 prepares them for transmission on a system management bus.

Another piece of software is the BIOS/firmware 409 that can also access the battery interface layer to use and track battery information. Some devices may choose to use the BIOS/firmware layer 408 to monitor the battery status rather than using application software 402 or device drivers 406 within the operating system 404. The BIOS/firmware 409 can monitor the battery status in the same way. When the BIOS/firmware 409 detects a problem, a message or interrupt is issued to the upper layer software, which is interpreted to give the computer user a warning message, turn on a status indicator, or perform some other action.

In this example, the interface layer 408 ensures that the status requests and data to and from the rechargeable battery of the computer are communicated to the system software. The battery of this embodiment is a "smart battery" that complies with the Smart Battery Data Specification from the Smart Battery Specifications Implementers Forum (SBS-IF). Other "control method" batteries as defined in ACPI 2.0 industry specification can also provide the same information for this invention. Embedded battery code 410 controls the logic circuits on the battery and handles status requests. The embedded battery code 410 can be designed to support one or more different types of protocols, such as the system management bus. Upon the receipt of requests for status or other battery characteristics, the embedded battery code 410 responds with the required information. Furthermore, the embedded battery code 410 of this embodiment can control the recharging, discharging, and cycling of the battery.

Figure 5:
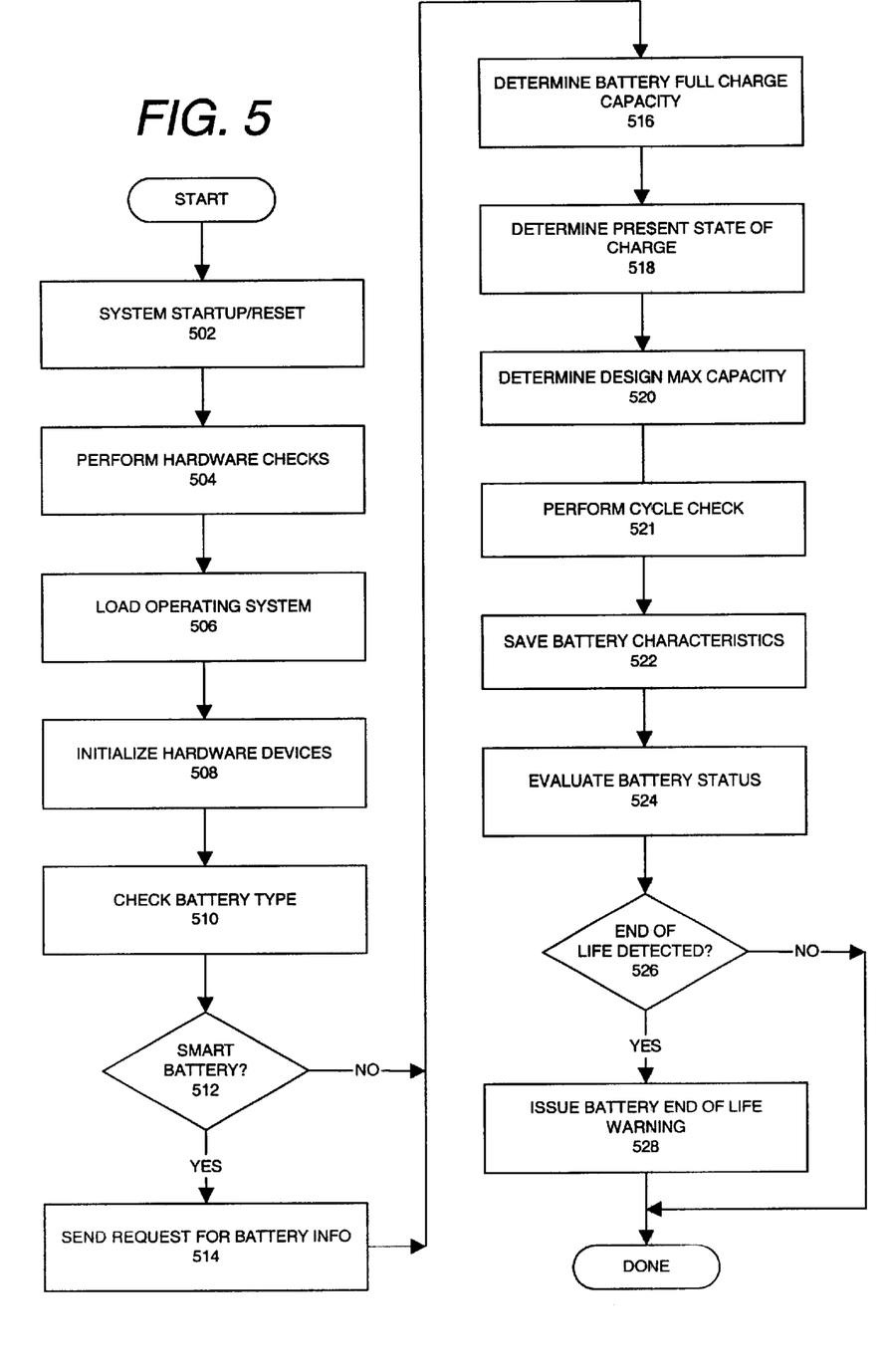
FIG. 5 is a flow chart showing one embodiment of a method to initialize a computer to detect the end-of-life for a rechargeable battery.

FIG. 5 is a flow chart showing one embodiment of a method to initialize a computer to detect the end-of-life for a rechargeable battery in accordance with the present invention. This example generally describes the initialization operation of a notebook computer including a detection mechanism of one embodiment during a system startup or reset. At block 502, the computer emerges from a system startup or reset sequence. The computer performs a hardware check of onboard components and devices at 504. In another embodiment, the BIOS/firmware may perform the battery status check operations of blocks 510 through 528 blocks around the time periods when the hardware checking 504 and operating system load 506 are happening. This hardware check can entail a query to determine what components and devices are physically present in the computer and whether they are operational. For this embodiment, these onboard components and devices can include items physically connected to the motherboard like hard disk drives, floppy drives, CD ROM drives, bus controllers, wireless transceivers, and video cards. The operating system is loaded at block 506. At block 508, the hardware devices found during the hardware checks of block 504 are initialized and configured for use. The computer performs a check of any batteries installed in the system at block 510. At block 512, the computer checks whether any battery found is a smart battery.

If a smart battery is found at block 512, the computer sends a request for battery info to the smart battery at block 514. Because a smart battery is intelligent, the battery can respond with its operating characteristics and conditions. Thus with a smart battery, the computer does not necessarily have to locate and examine the battery history to determine the status of the battery. A smart battery may have such data and information stored on a memory or other circuitry within the battery itself. At block 516, a battery monitor mechanism in the computer determines the battery full charge capacity. The present state of charge is determined at block 518. The monitor also determines the designed maximum capacity of the battery at block 520. For one embodiment, one or more of the operations of blocks 516, 518, 520, are accomplished by examining device characteristics returned from requests to the smart battery. Thus, information such as the serial number, manufacturer, model number, design specifications, capacity, current, voltages, etc. may be easily provided from logic on the battery itself.

At block 521, a cycle check is performed on the battery. For a smart battery, the number of charge cycles made on the battery can also be determined from information requested from the battery itself. Battery end-of-life may also be determined by looking at the number of charge cycles for the given battery. Knowledge of the battery chemistry may indicate that the battery charge characteristics and its ability-to hold a charge radically drop off after a threshold of charge cycles. For example, a battery may be rated at 10,000 charge cycles by the manufacturer. When the battery reaches or exceeds the charge cycle threshold, the monitoring software may give a warning to the user that it is time to replace the battery.

At block 522, the battery characteristics and other relevant information are saved on the computer for future reference. The battery status is evaluated at block 524. In this example, the evaluation involves comparing the design capacity of the battery with the present full charge capacity. Over time, the ability to hold charge in the power cells of a battery is reduced, thus decreasing the storage capacity of the battery. As the present full charge capacity diminishes relative to the original design capacity, this is a sign that the battery cells are being worn and will eventually be unable to hold any useful charge. For another embodiment, the evaluation involves comparing the original maximum capacity of the battery when it was new versus the present full charge capacity. The battery monitor checks whether a battery end of life is detected at block 526.

Depending on what threshold is set for whether a battery end-of-life is reached, the monitor will determine whether the battery has reached a critical level and if the battery cells will be unable to hold significant charge. If the monitor finds that the threshold limit for the battery end-of-life has been reached at block 526, a battery end-of-life warning is issued at block 528. The end-of-life threshold can be set by the battery manufacturer (knowing the exact characteristics of the battery chemistry), by the manufacturer of the equipment using the battery (knowing the output necessary from the battery for adequate operation of the device), and/or by the user. The user should replace the battery in the near future, if not as soon as possible, in order to avoid data loss or equipment downtime. The monitor may also be designed to repeat warnings at regular intervals until the battery is replaced. In one embodiment, the monitor has access to the Internet or a wireless transceiver or some other communication interface. Thus the monitor can also communicate battery end-of-life warnings via email or text messaging to another person such as a secretary or technical support technician. Furthermore, the battery monitor may request the battery manufacturer and model number from the battery, and in turn provide the user with information regarding a replacement battery. The monitor may also include a hot link to the Internet for a site to purchase a new battery or even current prices.

But if the battery is not found to be a smart battery at block 512, the battery monitor has to derive the needed battery characteristics and information through alternative means. For this embodiment, a battery is considered not smart if it has no memory to store device characteristics or if it does not have any logic circuitry. The operations at block 516, 518, 520, 521, in this situation are similar to the case where a smart battery is present, but proceed differently. If relevant data was previously gathered and stored for this battery, the battery monitor may be able to simply access the appropriate record on the computer and reload the battery characteristics into memory. If the battery was not encountered at this computer before, some or all of the information may need to be entered by the user. For instance, if the battery cannot provide the information through it's "smart" interface, the user may be able to enter a model number and provide a unique name or serial number for the particular battery. The battery monitor can reference a database to discover the battery specifications. Otherwise, the user may be prompted to enter the necessary characteristics. At block 516, the battery monitor determines the battery full charge capacity. The power subsystem of one embodiment can include measuring circuitry with a voltage divider, calculation logic, and analog comparator to measure voltages and currents at the battery and recharger. The battery monitor determines the present stage of charge in the battery at block 518. At block 520, the designed maximum capacity of the battery is determined. A cycle check is conducted at block 521 to determine the number of charge cycles.

These battery characteristics including the capacity values, voltages, currents, etc. are saved into memory at block 522 for future reference. The battery monitor evaluates the battery status at block 524. For this example, the battery monitor performs a number of calculations to formulate the present battery status. A check is made at block 526 as to whether the battery end-of-life has been detected. If the end-of-life condition has been discovered, the battery monitor issues a warning at block 528. If an end-of-life does not exist, then the computer proceeds with normal operations.

For another embodiment of the present invention, the battery monitor performs a battery check when the system is shut down. The battery monitor records and saves into memory pieces of information including the available charge, battery state, identifier, and technology type. Upon the subsequent system start up, the battery monitor pulls the stored battery information from memory. After verifying that the presently installed battery is the same one that at shut down, the battery monitor checks whether the charge leakage is within acceptable limits. For instance, the battery monitor can calculate the leakage by dividing the difference in the amount of stored charge at shut down and start up by the elapsed time from shut down to start up. If this test discovers that an abnormal charge loss has occurred or if the leakage is not acceptable, a warning is issued to alert the user.

Figure 6:
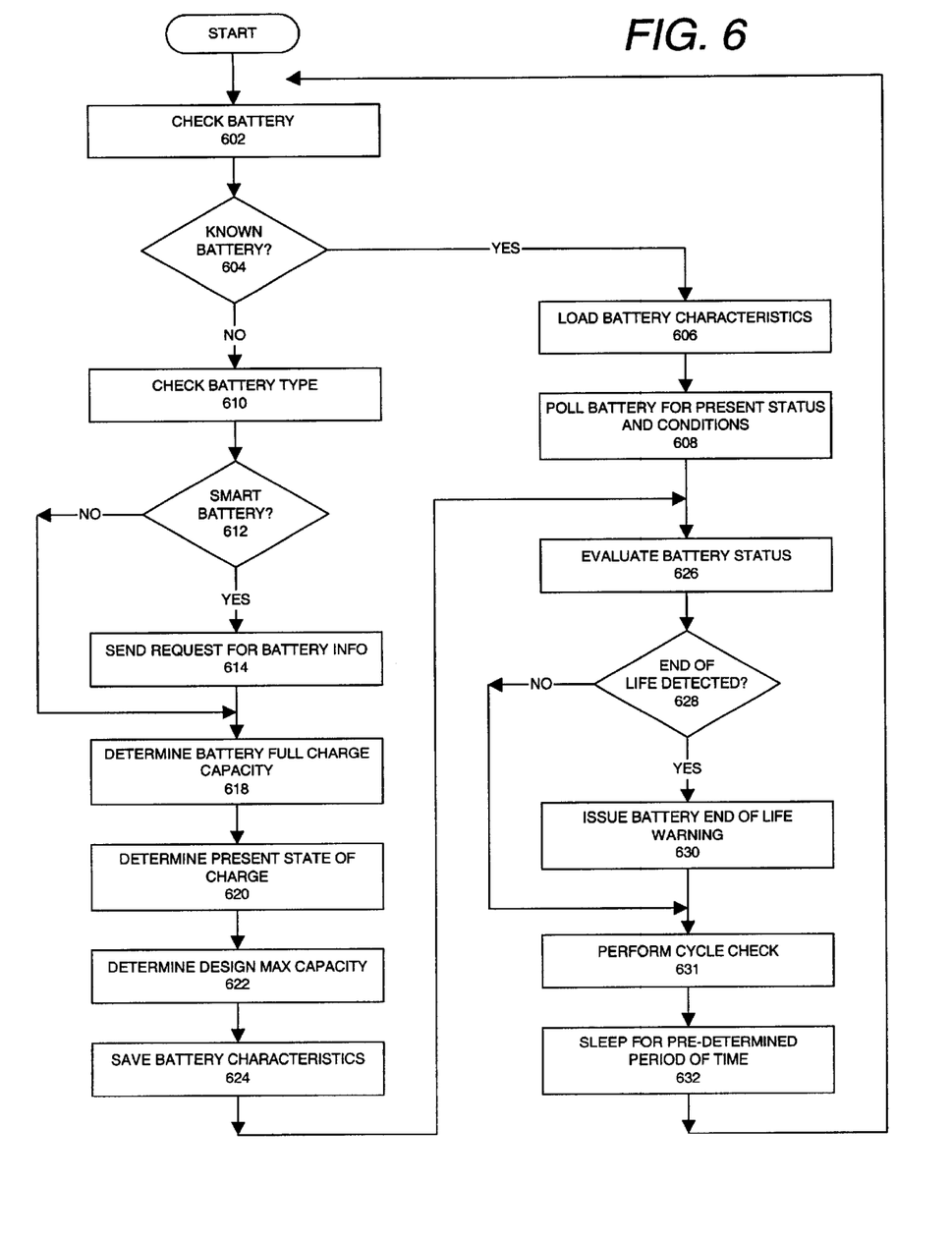
FIG. 6 is a flow chart showing one embodiment of a method in accordance with the present invention to evaluate a rechargeable battery and to detect its end-of-life.

FIG. 6 is a flow chart showing one embodiment of a method in accordance with the present invention to evaluate a rechargeable battery and to detect its end-of-life. At block 602, the battery monitor checks the rechargeable battery for an identifier or serial number. In the case where no identifier or serial number is available, the user may be notified of a "potential" battery failure. This warning is qualified with language indicating that the message may be false if the battery has just been swapped. The monitor at block 604 determines whether the present battery is a known battery or not. A known battery is one that this monitor has previously encountered or examined or this battery has its profile stored in a memory location accessible to the battery monitor. If the battery is found to be known, the battery monitor loads the battery profile and characteristics at block 606. This battery is polled/queried at block 608 for its present status and conditions. The monitor evaluates the present battery status at block 626. At block 628, a determination is made as to whether an end-of-life condition is detected for this battery. If an end-of-life threshold has been reached and thus the end-of-life condition present, the battery monitor issues a battery end-of-life warning at block 630. A cycle check is performed at block 631 to determine whether the battery is approaching or exceeded the recommended number of charge cycles. If the charge cycle threshold is surpassed, the monitor issues a warning to replace the battery. The battery monitor of this embodiment enters a sleep mode at block 632 for a predetermined period of time before reevaluating the battery.

If the battery is found not to be known at block 604, the battery monitor checks the battery type at block 610. The monitor at block 612 determines whether the present battery is a smart battery or not. A smart battery in this embodiment is defined as one having logic and/or memory within the battery and capable of responding to information requests. If the present battery is a smart battery, the battery monitor sends a request to the battery for information at block 614. If the battery is not smart, the monitor has to derive the needed battery characteristics through alternative means as describe above. The monitor determines the battery full charge capacity at block 618. At block 620, the monitor determines the present state of charge in the battery. The design maximum capacity of this battery is determined at block 622. These battery characteristics are saved into static storage (flash memory, hard disk, or other storage media) at block 624 for future reference, causing this particular battery to be recognized and considered known in future status checks. The battery status is evaluated at block 626 and proceeds through the operations of blocks 628, 630, 631, 632, as described above.

Although the above examples describes a battery monitor for the detection of battery status and end-of-life in the context of a hardware controller and logic, other embodiments of the present invention can be accomplished by way of software. Such software can be stored within a memory in the system. Similarly, the code can be distributed via a network or by way of other computer readable media. For instance, a computer program may be distributed through a computer readable medium such as a floppy disk or a CD ROM, or even a transmission over the Internet. Thus, a machine- readable medium can include any mechanism for storing or transmitting information in a form readable by a machine (e.g., a computer). For example, a machine-readable medium can include a read only memory (ROM), random access memory (RAM), magnetic disk storage media, optical storage media, flash memory devices, and electrical, optical, acoustical or other forms of propagated signals (e.g., carrier waves, infrared signals, digital signals, etc.).

This battery information can be made accessible not only to the user of the local machine but also across a network connection to an IT service organization to determine when a new battery should be acquired to proactively replace it before the user encounters a problem.

In the foregoing specification, the invention has been described with reference to specific exemplary embodiments thereof. It will, however, be evident that various modifications and changes may be made thereof without departing from the broader spirit and scope of the invention as set forth in the appended claims. The specification and drawings are, accordingly, to be regarded in an illustrative rather than a restrictive sense.

What is claimed is:

1. A method comprising:
    identifying a rechargeable battery;
    determining a designed capacity of said rechargeable battery;
    determining a present full charge capacity of said rechargeable battery;
    evaluating a status of said rechargeable battery, said evaluating comprising calculating remaining capacity of said rechargeable battery as a percentage of said designed capacity, said percentage calculated as dividing said present full charge capacity by said designed capacity; and
    issuing an end-of-life warning for said rechargeable battery if an end-of-life status is detected.

2. The method of claim 1 further comprising checking whether said rechargeable battery is a smart battery.

3. The method of claim 2 further comprising sending a request to said smart battery for battery information.

4. The method of claim 3 wherein said battery information comprises a serial number and battery type to uniquely identify a battery.

5. The method of claim 4 wherein said determining said designed capacity comprises requesting said designed capacity value from said smart battery.

6. The method of claim 1 further comprising saving said designed capacity, said present full charge capacity, and a unique identifier for said rechargeable battery to a record.

7. The method of claim 6 wherein said evaluating further comprises comparing said percentage against a threshold level, said threshold level defined as a capacity level below which said rechargeable battery is at its end-of-life.

8. The method of claim 7 further comprising:
    checking a number of charge cycles that have been conducted on said rechargeable battery, and issuing a cycling warning if said number of charge cycles has exceeded a cycling threshold; and
    performing a charge leakage calculation to determine whether said leakage from said rechargeable battery is not acceptable.

9. A method comprising:
    checking whether said battery is a smart battery;
    checking whether a battery is known;
    loading a profile for said battery if said battery is known;
    requesting battery information if said battery is not known, said requesting comprising sending information requests to said battery if said battery is smart and comprising querying a user for said battery information if said battery is not smart;
    polling said battery for a present battery status;
    evaluating said present battery status to determine whether said battery has reached an end-of-life condition; and
    issuing a warning if said end-of-life condition exists.

10. The method of claim 9 wherein said checking comprises reading a unique identifier for said battery and comparing said identifier with a list of known batteries, said known batteries having stored records with battery characteristics.

11. The method of claim 10 wherein said battery information comprises a designed capacity for said battery and a battery technology type.

12. The method of claim 11 wherein said polling comprises querying said battery for a present full charge capacity if said battery is smart, and wherein said polling comprises measuring said full charge,capacity if said battery is not smart.

13. The method of claim 12 wherein said evaluating said present battery status comprises calculating a remaining life value for said battery as a percentage of said designed capacity, said remaining life value based on what percent of said designed capacity is represented by said present full charge capacity.

14. The method of claim 13 wherein said end-of-life condition is present if said remaining life value is below a threshold level, said threshold level defined as a battery capacity value above which said battery is capable of holding a sufficient amount of charge.

15. An apparatus comprising:
    a rechargeable battery to provide stored charge from power cells;
    a monitoring circuit coupled to said rechargeable battery, said monitoring circuit to measure voltages and currents across said rechargeable battery, said monitoring circuit further to determine a present full charge capacity in said rechargeable battery; and
    a controller coupled to said monitoring circuit, said controller to detect a battery end-of-life condition in said rechargeable battery, wherein said controller is to calculate a remaining life value for said rechargeable battery as a percentage of a designed capacity for said rechargeable battery, said remaining life value based on what percent of said designed capacity is represented by said present full charge capacity.

16. The apparatus of claim 15 further comprising a display screen coupled to said controller, said display screen to provide a battery end-of-life warning upon detection of said end-of-life condition.

17. The apparatus of claim 16 wherein said controller evaluates a present battery status to determine whether said rechargeable battery has reached an end-of-life condition.

18. The apparatus of claim 17 wherein said end-of-life condition is present if said remaining life value is below a threshold level, said threshold level defined as a battery capacity value above which said rechargeable battery is capable of holding a sufficient amount of charge.

19. The apparatus of claim 18 further comprising a charger to recharge said rechargeable battery.

20. A machine readable medium having embodied thereon a computer program, said computer program being executable by a machine to perform a method comprising:
   identifying a rechargeable battery;
   determining a designed capacity of said rechargeable battery;
   determining a present full charge capacity of said rechargeable battery;
   evaluating a status of said rechargeable battery, said evaluating comprising calculating a remaining capacity of said rechargeable battery as a percentage of said designed capacity, said percentage calculated as dividing said present full charge capacity by said designed capacity; and
   issuing an end-of-life warning for said battery if an end-of-life status is detected.

21. The machine readable medium of claim 20 wherein said evaluating further comprises comparing said percentage against a threshold level, said threshold level defined as capacity level below which said rechargeable battery is at its end-of-life.

22. The machine readable medium of claim 21 further comprising storing a first value indicating an amount of charge stored in said rechargeable battery upon shutdown.

23. The machine readable medium of claim 22 further comprising reading at startup said first value and a second value indicating an amount of charge stored in said rechargeable battery upon startup, and calculating a charge leakage value from said first and second values and time elapsed between said shutdown and startup.

24. The machine readable medium of claim 23 further comprising issuing a charge leakage warning if said charge leakage value is not acceptable.

25. The machine readable medium of claim 24 checking number of charge cycles that have been conducted on said rechargeable battery, and issuing a cycling warning if said number of charge cycles has exceeded a cycling threshold.

* * * * *

UNITED STATES PATENT AND TRADEMARK OFFICE
CERTIFICATE OF CORRECTION

PATENT NO.     : 6,545,448 B1
DATED          : April 8, 2003
INVENTOR(S)    : Stanley et al.

It is certified that error appears in the above-identified patent and that said Letters Patent is hereby corrected as shown below:

<u>Title page,</u>
Item [57], ABSTRACT,
Line 4, delete "batterty", insert -- battery --.

<u>Column 2,</u>
Line 31, after "end-of-life", insert -- for --.
Line 37, delete "inverition", insert -- invention --.

Signed and Sealed this

Sixteenth Day of September, 2003

JAMES E. ROGAN
*Director of the United States Patent and Trademark Office*